United States Patent [19]

Clark et al.

[11] Patent Number: 4,690,962
[45] Date of Patent: Sep. 1, 1987

[54] COMPOSITION, COATED ARTICLE AND METHOD OF COATING

[75] Inventors: Roger J. Clark, Underhill, Vt.; James Economy, San Jose, Calif.; Mary A. Flandera, Endicott, N.Y.; John R. Susko; Robin A. Wheater, both of Owego, N.Y.

[73] Assignee: International Business Machines Corporation, Armonk, N.Y.

[21] Appl. No.: 835,083

[22] Filed: Apr. 7, 1986

Related U.S. Application Data

[60] Division of Ser. No. 628,980, Jul. 12, 1984, Pat. No. 4,592,944, which is a continuation of Ser. No. 381,485, May 24, 1982, abandoned.

[51] Int. Cl.$^4$ .................. C08K 5/34; C08K 5/00; C08L 49/00
[52] U.S. Cl. .................. 524/94; 524/360; 524/370; 524/378; 524/529; 524/535; 524/538; 524/537; 524/588; 524/612; 525/202; 525/275; 526/285
[58] Field of Search ............ 524/81, 529, 94, 360, 524/370, 378, 535, 538, 537, 588, 612; 525/202, 275; 526/285

[56] References Cited

U.S. PATENT DOCUMENTS

| | | | |
|---|---|---|---|
| 2,838,469 | 6/1958 | Buselli et al. | 525/202 |
| 4,070,333 | 1/1978 | Jabloner | 526/285 |
| 4,108,942 | 8/1978 | Chalk et al. | 526/159 |
| 4,258,079 | 3/1981 | Economy et al. | 427/44 |
| 4,273,906 | 6/1981 | Economy et al. | 526/217 |
| 4,339,526 | 7/1982 | Baise et al. | 427/96 |

*Primary Examiner*—Joseph L. Schofer
*Assistant Examiner*—N. Sarofim
*Attorney, Agent, or Firm*—Pollock, Vande Sande & Priddy

[57] ABSTRACT

An electronic circuit having an electrically conductive pattern formed on a substrate and having on at least one surface of the substrate a film obtained from a soluble polymerizable oligomer of the formula:

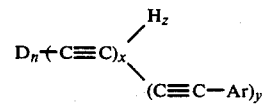

wherein D is

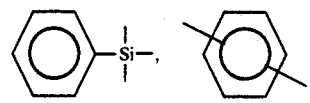

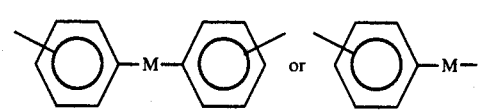

wherein M is —C≡C—, —C≡C—C≡C, —O—,

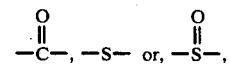

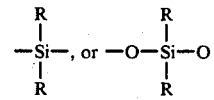

wherein R is an alkyl or aromatic group; wherein Ar is an aromatic group; wherein x is an integer greater than two but less than 30, z is either zero or an integer, and y is an integer wtih the sum of y and z equal to x; and wherein n is an integer from 1 to 10. The substrate is coated by applying the above composition to the substrate and then hardening the composition by further polymerization. Preferred compositions contain the above described oligomer and certain plasticizers and/or toughening agents.

19 Claims, 1 Drawing Figure

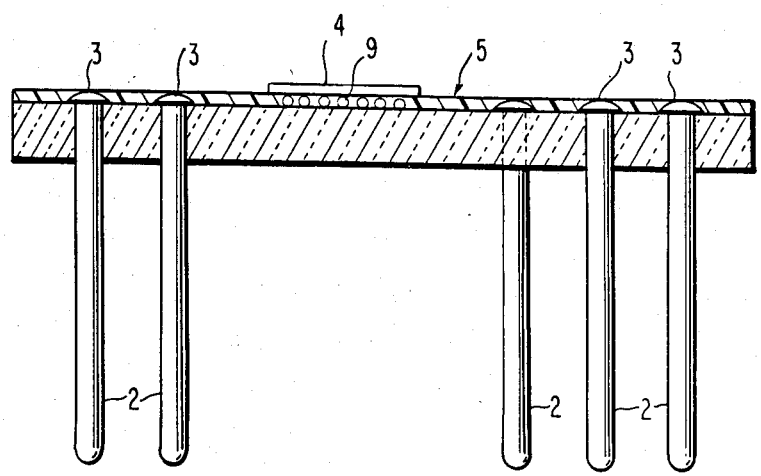

COMPOSITION, COATED ARTICLE AND METHOD OF COATING

This is a divisional of application Ser. No. 628,980, filed on July 12, 1984, U.S. Pat. No. 4,592,944, which, in turn, is a continuation of application Ser. No. 381,485, filed May 24, 1982 and now abandoned.

TECHNICAL FIELD

The present invention is concerned with coating a substrate which contains an electrically conductive pattern on at least one major surface of the substrate and is especially concerned with providing a top seal to coat solder connector patterns under an attached integrated circuit chip. The present invention is also concerned with the method for providing such a coating. In addition, the present invention is concerned with certain preferred compositions which are suitable for providing a top seal.

BACKGROUND ART

During the preparation of integrated circuit modules, input/output (I/O) pins are inserted into a substrate. The input/output pins provide the needed electrical connections to the integrated circuit chip or chips which are subsequently connected to the substrate or carrier. The integrated circuit chips are attached to the integrated circuit substrate or carrier by applying solder to preselected areas on the substrate which is generally referred to in the art as the "chip pad area". Such areas can be defined, for instance, by providing preselected exposed areas of a metal which will accept the solder, such as copper. In addition, a solder flux composition is normally applied to the substrate to facilitate the application of the solder to the chip pad area. After solder is applied to the chip pad area, any flux and/or flux residue is removed prior to attaching the integrated circuit chip so as to provide as clean a module as possible.

After attachment of the integrated circuit chip(s) and subsequent flux residual removal, a top seal coating composition is applied to the integrated circuit module in order to protect the top side of the module which contains the integrated circuit chip from corrosion and/or electromigration.

Top seal compositions are employed in order to prevent failure of the substrate and device due to corrosion; to immoblize conductive particles; to extend the thermal fatigue life of the solder interconnection between the substrate and chip; and to act as a protective barrier for alpha particle sensitive semiconductors. However, the top seal compositions which are now commercially employed, although for the most part, satisfactory, do not provide all of the above desirable functions to a satisfactory degree. For instance, the top seal compositions now employed provide satisfactory levels of at most three of the above functions. Accordingly, depending upon desired use of the integrated circuit module, one or more of the above functions is normally compromised by the selection of the particular top seal composition employed. One of the more common types of top seal compositions employed is obtained from curing a composition containing as the binder a polyamide-imide.

In addition, the top seal composition must possess the type of flow characteristics needed to coat the solder pattern in a reliable and controllable manner.

SUMMARY OF INVENTION

The present invention makes it possible to achieve all of the above-discussed objectives desired from a top seal composition at satisfactory levels, and, therefore, none of such functions need to be compromised. In particular, the present invention provides for uniform coating of complex solder connection patterns under an attached integrated circuit chip. Moreover, the present invention provides for an excellent $\alpha$ particle barrier beneath the chip and provides for excellent passivation of the metallurgy on the chip. In addition, the coatings, in accordance with the present invention, are extremely thermal stable and are tough when cured. Moreover, the coatings when formed from the compositions of the present invention are essentially free from pinholes.

In particular, the present invention is concerned with an electronic circuit which includes a substrate; an electrically conductive pattern formed on the substrate; and a coating on at least one surface of the substrate.

The coating is a continuous film formed from a soluble, polymerizable oligomer having a number average molecular weight of from about 200 to about 10,000, having at least more than two pendant acetylenic groups and having the formula:

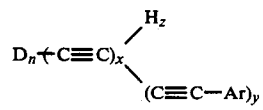

wherein D is

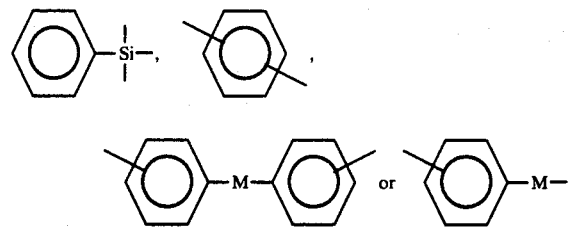

wherein M is —C≡C—, —C≡C—C≡C, —O—,

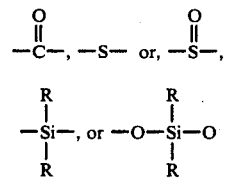

wherein R is an alkyl or aromatic group; wherein Ar is an aromatic group; wherein x is an integer greater than two but less than 30, z is either zero or an integer, and y is an integer with the sum of y and z equal to x; and wherein n is an integer from 1 to 10.

Moreover, the present invention is concerned with a method for providing a coating on a substrate which substrate contains an electrically conductive pattern. The process comprises coating at least one major surface of the substrate with a composition containing a soluble polymerizable oligomer as described hereinabove and then hardening the composition by further polymerization of the oligomer.

Another aspect of the present invention is a composition which contains a soluble polymerizable oligomer as described hereinabove and at least one plasticizer and/or at least one toughener. The plasticizer can be diphenyl diacetylene, and/or diphenylbutadiene, and/or diphenylether, and/or phenyltriethynyl silane, and/or 4,4'diethynyldiphenyl ether. The toughener can be aromatic diphenyl ether; acrylonitrile polymers, polyimides, polyesters, polysilicones, polyquinoxalines, cyclized poly(arylacetylene) polymers or mixtures of any of the above. The plasticizer and/or toughener are present in an amount sufficient to increase the fluidity and/or toughness, respectively, of the composition.

DESCRIPTION OF DRAWING

The FIGURE is a schematic cross section of a substrate and chip containing a top seal composition in accordance with the present invention.

BEST AND VARIOUS MODES FOR CARRYING OUT INVENTION

According to the present invention, a continuous film is formed on a substrate from a composition containing a soluble, polymerizable oligomer having a number average molecular weight of from about 200 to about 10,000, having at least more than two pendant acetylenic groups and having the general formula:

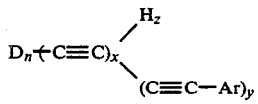

wherein D is

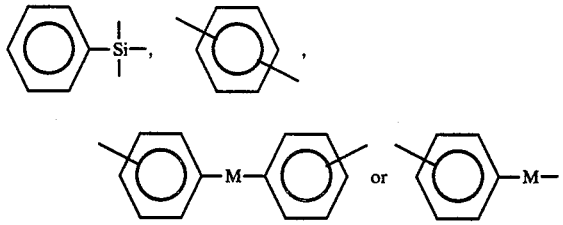

wherein M is —C≡C—, —C≡C—C≡C, —O—,

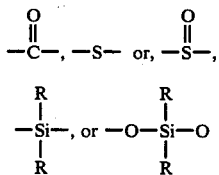

wherein R is an alkyl or aromatic group; wherein Ar is an aromatic group; wherein x is an integer greater than two but less than 30, z is either zero or an integer, and y is an integer with the sum of y and z equal to x; and wherein n is an integer from 1 to 10. Generally such R alkyl groups contain 1-6 carbon atoms and such aromatic groups contain 6-10 carbon atoms.

Oligomers employed according to the present invention are disclosed along with a method for the preparation thereof in U.S. Pat. Nos. 4,258,079 and 4,273,906 and U.S. patent application Ser. No. 956,517, filed Oct. 31, 1978 and now abandoned, disclosures of which are incorporated herein by reference. The polymers are prepared by reacting a monomer containing at least two acetylenic groups in the presence of a molar excess over the monomer of an aromatic monoacetylenic capping agent and in the presence of an oxygen-carrying amine-basic cupric salt complex catalyst. The preferred capping agent is an aromatic monoethynyl compound which can be represented by the formula:

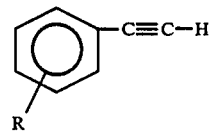

wherein R is H, halogen, lower alkyl containing up to about 6 carbon atoms, or lower alkoxy containing up to about 6 carbon atoms. The most preferred capping agent is phenylacetylene. The single ethynyl group of the capping agent enters into the coupling reaction, but because the molecule has only one ethynyl group, further coupling is terminated. A molar excess of the capping agent is employed so that the molecular weight of the oligomer is properly controlled.

Examples of amines employed to provide the catalyst include pyridine and alkylene polyamines such as tetramethylethylene diamine. A suitable copper salt to employ to provide the catalyst is CuCl. The catalyst can be preoxidized by bubbling $O_2$ through the mixture for several minutes before the addition of the catalyst to the reaction mass.

The oligomers employed in the present invention are preferably obtained from 1,3,5 triethynylbenzene. The preferred molcular weight of oligomers employed in the present invention is about 400 to about 2000. Preferably, at least 60% of the acetylenic groups for purposes of the present invention are diacetylenic and most preferably each oligomer molecule contains at least two diacetylenic groups. It is most preferred that diacetylenic groups constitute most of the pendant acetylenic groups.

The preferred oligomers have up to 20% ethynyl content. Mixtures of the above oligomers can be employed. In addition, the ingredients in D in the above formula may be mixtures of the material specified. By polymerizing mixtures of the oligomers, useful copolymers can be obtained. Furthermore, the aromatic groups can be substituted such as by alkyl groups of up to 6 carbon atoms and by halogens. Such substitutents do not enter into or interfere with the polymerization reaction. However, because the compositions are intended for high temperature use, preferably alkyl groups are not present in view of their tendency to degrade at elevated temperatures. Examples of aromatic groups include phenyl and biphenyl.

The most preferred oligomer employed according to the present invention has the following characteristics:
6-20% free ethynyl groups per aromatic ring.
$\overline{M}_z = \sim 1500\text{-}2500$
$\overline{M}_w = \sim 1000\text{-}1200$
$\overline{M}_n = \sim 700\text{-}900$ The preferred oligomers employed in the present invention can be prepared in accordance with Example 1 or Example 2 of U.S. Pat. No. 4,273,906, and most preferably in accordance with Example 2.

The coating compositions employed according to the present invention preferably contain a toughening agent and/or plasticizer and are preferably employed in solution form. Examples of suitable plasticizers include diphenyldiacetylene, diphenylbutadiene, (i.e.

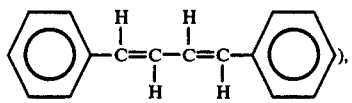

diphenylether, phenyltriethynyl silane, and 4,4'-diethynyldiphenyl ether.

Examples of suitable tougheners include aromatic diphenyl ether, cyclized poly(arylacetylene) polymers, acrylonitrile polymers such as copolymers of acrylonitrile and styrene, and of acrylonitrile and butadiene, polyimides, polyquinoxalines, polyesters, and polysilicones. The preferred tougheners are aromatic diphenylether and cyclized poly(arylacetylene) polymers such as H-resin commercially available from Hercules Incorporated.

Aromatic diphenylether can be represented by the structure

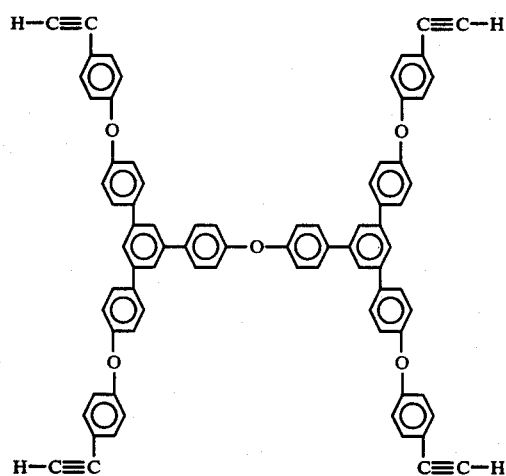

Aromatic diphenyl ether can be prepared by admixing about 1.09 grams of 4,4'diethynyldiphenyl ether

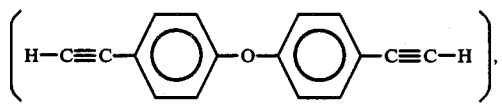

about 0.05 grams of nickel-acetylacetonate, and about 0.10 grams of triphenylphosphine in about 75 ml of dioxane. The solution is heated to about 80° C. and allowed to remain at that temperature for about 6 hours with constant stirring. The reaction mixture is then poured onto 500 ml of petroleum ether. The precipitate is collected, washed and dried to provide the desired aromatized 4,4'-diethynyldiphenyl ether.

The preferred cyclized poly(arylacetylene) polymer component is H-resin which is commercially available from Hercules Incorporated, and is a mixture of about 70–80% by weight of a cyclized poly(arylacetylene) polymer of the structure

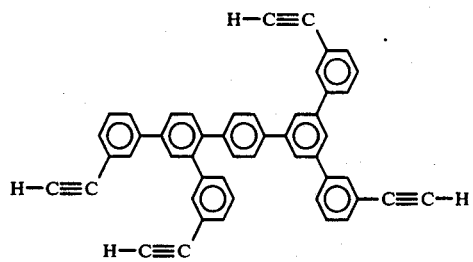

with about 20–30% by weight of diphenyldiacetylene. Such polymers can be prepared in accordance with the procedure suggested in U.S. Pat. No. 4,070,333 to Jabloner, disclosure of which is incorporated herein by reference.

The polyacetylenically substituted aromatic compounds used to prepare the cyclized poly(arylacetylene) can be an aromatic compound which contains at least two acetylenic groups attached to the same aromatic ring or to different aromatic rings in the compound, or mixtures of such compounds. The acetylenic groups can be internal, i.e., acetylene groups of the type aryl—C≡C—aryl, or they can be external, i.e. ethynyl groups of the type aryl—C≡C—H, or both types can be present in the polyacetylenic compound.

Examples of such materials are m- and p-diethynylbenzenes; diethnyl toluenes; diethynyl xylenes; 9,10-diethynylanthracene; diethynylbiphenyl; 9,10-diethynylphenanthrene; 4,4'-diethynyl-trans-azobenzene; di(ethynylphenyl)ether; 2,3,5,6-tetrachloro-1,4-diethynylbenzene; diphenyl-diacetylene; dibenzyl-diacetylene; di-p-tolyldiacetylene; di-α-naphthyldiacetylene; 1-chloro-2,5-diethynylbenzene; 2,2'-dichlorodiphenyldiacetylene; 4,4'-dichlorodiphenyldiacetylene; 4,4'-dibromodiphenyldiacetylene; 1,4-bis(phenylethynyl)benzene; 1,3-bis(phenylethynyl)benzene; 9,10-bis(phenylethynyl)anthracene; 1,3,5-triethynylbenzene; 1,2,4-triethynylbenzene; 1,3,5-tris(phenylethynyl)-2,4,6-triphenylbenzene; 1,2,4-tris(phenylethynyl)-3,5,6-triphenylbenzene; and tris(ethynylphenyl)benzene The reaction can be carried out by heating the polyacetylenically substituted aromatic compound with an aromatization catalyst. The reaction can be carried out in bulk or in the presence of an inert diluent. Any inert diluent can be used, as, for example, ethers such as 1,2-dimethoxyethane, dioxane and tetrahydrofuran, or aromatic hydrocarbons such as benzene, toluene and xylene.

Any aromatization catalyst can be used to effect the cyclization reaction. By the term aromatization catalyst is meant a catalyst that promotes the formation of an aromatic ring by the cyclization of three acetylene groups.

Aromatization catalysts include nickel catalysts such as nickel bis(acrylonitrile), nickel bis(acraldehyde), nickel carbonyl bis(triphenylphosphine), nickel cyanide bis(triphenylphosphine), nickel acetylacetonate in combination with triphenylphosphine, and the Group V-B metal halides such as niobium pentahalides and tantalum pentahalides. The amount of the Catalyst used generally will be from about 0.5 to about 5% of the monomer by weight.

The polymerization is carried out by heating the polyacetylenic monomer with the catalyst to a temperature of from about 55° C. to about 250° C., and preferably from about 80° C. to about 150° C. Preferably the reaction is carried out in an inert atmosphere. The reaction is generally stopped at monomer conversion above about 30% and below about 90%, and preferably at a monomer conversion of from about 50% to about 90%. By so doing, it is possible to produce a prepolymer having a number average molecular weight of from about 900 to about 12,000, avoid the production of the very high molecular weight polymer that is cross-linked and at the same time retain in the prepolymer at least about 5%, and preferably about 5 to 20%, acetylene groups by weight of the prepolymer for reaction in second stage. At least 50% of the acetylenic unsaturation of the monomer is converted into aromatic structures.

In addition, the above polymers as supplied commercially can contain minor amounts such as about 5 to about 40% and preferably about 20 to about 30% by weight based on the polymer of an acetylenically substituted aromatic compound for modifying the flow properties of the polymer. Examples of such compounds are beta-naphthylacetylene, biphenylacetylene, 4-ethynyl-trans-azobenzene, diphenylacetylene, di-m-tolylacetylene, di-o-tolylacetylene, bis(4-ethylphenyl)acetylene, bis(3,4-dimethylphenyl)acetylene, bis(4-chlorophenyl)acetylene, phenyl benzoyl acetylene, beta-naphthylphenylacetylene, di(alpha-naphthyl)acetylene, 1,4-diethynylnaphthalene, 9,10-diethynylanthracene, 4,4'-diethynylbiphenyl, 9,10-diethylnylphenanthrene, 4,4'-diethynyl-transazobenzene, 4,4'-diethynyldiphenyl ether, 2,3,5,6-tetrachloro-1,4-diethynylbenzene, diphenylbutadiyne, di-p-tolyl-diacetylene, dibenzyldiacetylene, 2,2'-dichlorodiphenyl diacetylene, 3,3'-dichlorodiphenyl diacetylene, di(alpha-naphthyl)diacetylene, and diethynyldiphenyl butadiyne.

Polyquinoxalines can be represented by the formula

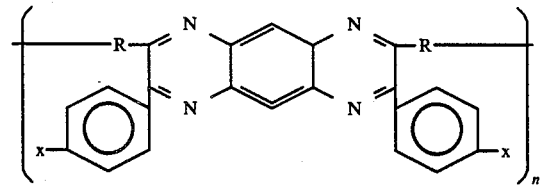

wherein n is a whole number integer of about 2 to about 25; and R is an arylene group containing 6-10 carbon atoms; or an alkylene group containing 1-6 carbon atoms; or oxybisphenylene and x is an alkyl of 1-6 carbon atoms, or OH, or alkoxy of 1-6 carbon atoms, or aroxy of 6-10 carbon atoms.

The polyquinoxalines can be prepared by reacting

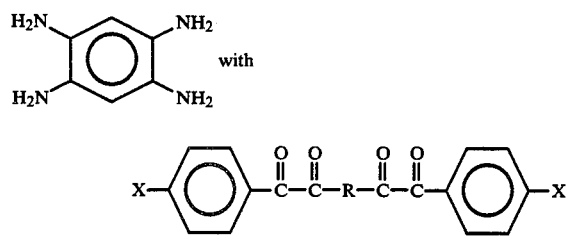

The polyesters employed are preferably obtained from aromatic polycarboxylic acids. The plasticizers and/or tougheners are generally employed in amounts of about 10 to about 75% by weight based upon the weight of the oligomer, and preferably about 25 to about 50% by weight based upon the weight of the oligomer.

In addition, it is preferred that the composition be applied as a solution in order to achieve the most advantageous wetting characteristics, especially when complex solder connection patterns are present connecting the chip to the substrate. The most preferred solvents are the reactive acetylenic solvents as discussed in U.S. Pat. No. 4,258,079. Examples of suitable solvents can be represented by the formula

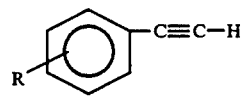

wherein R is H, halogen, lower alkyl of 1-6 carbon atoms, or lower alkoxy of 1-6 carbon atoms. The preferred actylenic solvent is phenylacetylene. Nonreactive solvents can be employed in place of or in combination with the reactive acetylenic solvents. Examples of suitable nonreactive solvents include alcohols, such as 1-butanol and 2-ethoxyethanol; (bis(2-methoxyethyl)ether); cyclohexanone; and 1-methyl-2 pyrrolidinone. Preferably, the nonreactive solvents are oxygen-containing solvents. Preferred solvent systems include mixtures of 1-methyl-2-pyrrolidinone and 2-ethoxyethanol in an amount of about 5 to about 30 parts of 2-ethoxyethanol to about 70 to about 95 parts of 1-methyl-2-pyrrolidinone; 1-methyl-2-pyrrolidinone and 1-butanol in a ratio of about 50 parts to about 50 parts; and cyclohexanone and 2-ethoxyethanol in a ratio of about 60 parts to about 40 parts. The amount of oligomer relative to solvent is usually about 5 to about 75 mg, and preferably about 10-50 mg per ml of solvent.

The composition can be applied to the desired assembly of the chip attached to the carrier and permitted to flow to cover the intricate or complex electrical connection pattern between the substrate and chip. After this, the assembly is subjected to a curing technique in order to further polymerize the oligomer. The oligomer can be cured thermally, using ultraviolet light and/or using electron beam. Preferably, the oligomer is cured by thermal technique by heating to elevated temperature of about 150° to 250° C. The exposure to elevated temperature is usually carried out for about one-half to about 5 hours, and preferably about one-half to about two hours.

The FIGURE illustrates a cross section of an assembly of a carrier and a chip in accordance with the present invention.

Numeral 1 illustrates the substrate through which pins 2 extend or protrude from the back side thereof. Numeral 3 represents a small portion of the pins protruding on the top side of the substrate for carrying current thereto. The integrated circuit chip, such as a silicon or polycrystalline silicon chip, is represented by numeral 4 and is attached to substrate 1 with solder 9. In addition, the chip can be one of the preferred chips which is passivated or coated with quartz or a polyimide. The substrate is preferably a ceramic substrate. A ceramic is a product or material manufactured by the action of heat on earth raw materials. The preferred ceramic substrates include silicon oxides and silicates, such as aluminum silicate; and aluminum oxides.

Numeral 5 represents a top seal composition as employed according to the present invention. In a typical application, the top seal is a continuous pinhole free film of thickness of about 5 to about 50 microns, and preferably about 12 to about 25 microns.

Typical examples of preferred compositions employed according to the present invention are as follows:

EXAMPLE 1

About 20 mg of poly(1,3,5-triethynylbenzene) prepared in accordance with Example 2 of U.S. Pat. 4,273,906 and having 6–20% free ethynyl groups per aromatic ring, $\overline{M}_z$ of about 1500 to about 2500, $\overline{M}_w$ of about 1000 to about 1200, and $\overline{M}_n$ of about 700 to about 900 are dissolved in 1 ml of a solvent containing 1-methyl-2-pyrrolidinone and ethoxyethanol in a ratio of $\frac{1}{4}$. About 100$\mu$ liter of the composition is dispersed on 24 mm substrate containing a single silicon chip. This amount is equivalent to about 2 mg of polymer per substrate. The substances are loaded on firing sticks and are then placed in a drying oven at about 80°–90° C. for about 1 hour. The temperature is then raised to about 150° C. and maintained there for about 1 hour.

The solution wets and coats the entire surface of the module including underneath the chip. Upon drying and curing a continuous moisture-resistant film is produced.

EXAMPLE 2

About 20 mg of poly(1,3,5-triethynylbenzene) prepared in accordance with Example 2 of U.S. Pat. No. 4,273,906 and having 6–20% free ethynyl groups per aromatic rings, $\overline{M}_z$ of about 1500 to about 2500, $\overline{M}_w$ of about 1000 to about 1200, and $\overline{M}_n$ of about 700 to about 900 are dissolved in 1 ml of a solvent containing 1-methyl-2-pyrrolidinone and 1-butanol in a ratio of 1:1. About 180 $\mu$l of the composition is dispersed onto each 28 mm substrate. The substrates are loaded onto firing sticks and are dried at about 85°–90° C. per 1 hour and cured at about 170° C. for about 2 hours.

The solution wets and coats the entire surface of the module including underneath the chip. Upon drying and curing, a continuous, moisture-resistant film is produced.

EXAMPLE 3

About 16 mg of poly(1,3,4-triethynylbenzene) prepared in accordance with Example 2 of U.S. Pat. No. 4,273,906 and having 6–20% free ethynyl groups per aromatic ring, $\overline{M}_z$ of about 1500–2500, $\overline{M}_w$ of about 1000 to about 1200, and $\overline{M}_n$ of about 700 to about 900 and about 8 mg of H-resin available from Hercules Incorporated are dissolved in about 1 ml of a solvent combination of 1-methyl-2-pyrrolidinone and 1-butanol in a ratio of $\frac{2}{3}$. About 100 $\mu$l of the composition is dispersed onto a 24 mm substrate. The substrates are loaded on firing sticks and then placed in a drying oven at about 90° C. for 1 hour followed by a cure at about 150° C. for about 3 hours.

The solution wets and coats the entire surface of the module including underneath the chip. Upon drying and curing, a continuous, moisture resistant film is produced.

What is claimed is:

1. A composition capable of forming a continuous film comprising a soluble polymerizable oligomer wherein said oligomer is obtained from 1,3,5-triethynylbenzene, has a molecular weight of about 400 to about 2000, at least 60% of the acetylenic groups thereof are diacetylenic groups, each molecule of the oligomer contains at least two acetylenic groups, and the oligomer contains up to 20% by weight ethynyl content; and a plasticizer selected from the group of diphenyldiacetylene, diphenylbutadiene, diphenylether, phenyltriethynyl silane, 4,4'diethynyldiphenylether, and mixtures thereof; or a toughening agent selected from the group of cyclized poly(arylacetylene) polymer, aromatic diphenylether, acrylonitrile polymer, polyimides, polyquinoxalines, polyesters, or polysilicones, and mixtures thereof; or both.

2. The composition of claim 1 wherein said toughening agent is selected from the group of aromatic diphenyl ether and cyclized poly(arylacetylene) polymers.

3. The composition of claim 1 wherein the plasticizer or toughening agent or both is employed in amounts of 10 to 75% by weight based upon the oligomer.

4. The composition of claim 1 wherein the plasticizer or toughening agent or both is employed in amounts of about 25 to about 50% by weight based upon the weight of the oligomer.

5. The composition of claim 1 wherein said oligomer has about 6% to 20% free ethynyl groups per aromatic ring, a $\overline{M}_z$ of about 1500 to about 2500, a $\overline{M}_w$ of about 1000 to about 1200, and a $\overline{M}_n$ of about 700 to about 900.

6. The composition of claim 1 which also contains a solvent for said oligomer.

7. The composition of claim 6 wherein said solvent includes a reactive acetylenic solvent.

8. The composition of claim 7 wherein said acetylenic solvent is represented by the formula:

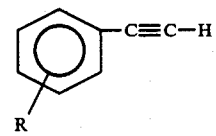

wherein R is H, halogen, lower alkyl, or lower alkoxy.

9. The composition of claim 8 wherein said acetylenic solvent is phenylacetylene.

10. The composition of claim 6 wherein said solvent includes a nonreactive solvent.

11. The composition of claim 10 wherein said nonreactive solvent is an oxygen-containing solvent.

12. The composition of claim 11 wherein said nonreactive solvent is selected from the group of alcohols, (bis)2-methoxyethyl(ether), cyclohexanone, and methyl-2-pyrrolidinone.

13. The composition of claim 12 wherein said alcohol is selected from the group of 1-butanol and 2-ethoxyethanol.

14. The composition of claim 12 wherein said oligomer is present in amounts of about 5 to about 80 mg per ml of solvent.

15. The composition of claim 12 wherein said solvent is a mixture of about 5 to about 30 parts of ethoxyethanol and about 70 to about 95 parts of 1-methyl-2-pyrrolidinone.

16. The composition of claim 12 wherein said solvent is a mixture of 1-methyl-2-pyrrolidinone and 1-butanol in a ratio of about 50 parts to about 50 parts.

17. The composition of claim 12 wherein said solvent is a mixture of cyclohexanone and ethoxyethanol in a ratio of about 60 parts to about 40 parts.

18. The composition of claim 1 which contains aromatic diphenyl ether.

19. The composition of claim 1 which contains cyclized poly(arylacetylene) polymer.

* * * * *